(12) United States Patent
Vu et al.

(10) Patent No.: US 6,798,266 B1
(45) Date of Patent: Sep. 28, 2004

(54) UNIVERSAL CLOCK GENERATOR USING DELAY LOCK LOOP

(75) Inventors: Cung Vu, San Jose, CA (US); Menping Chang, Cupertino, CA (US); June-Ying Chen, Milpitas, CA (US)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 10/446,233

(22) Filed: May 27, 2003

(51) Int. Cl.[7] .................................................. G06F 1/04
(52) U.S. Cl. ......................... 327/291; 327/99; 327/175; 365/233
(58) Field of Search ................................ 327/291–298, 327/175, 99, 299; 365/233

(56) References Cited

U.S. PATENT DOCUMENTS

| | | | | |
|---|---|---|---|---|
| 4,637,018 A | * | 1/1987 | Flora et al. ................. 714/700 |
| 5,329,188 A | * | 7/1994 | Sikkink et al. ............... 327/18 |
| 5,604,452 A | * | 2/1997 | Huang ......................... 327/99 |
| 5,646,558 A | * | 7/1997 | Jamshidi ..................... 326/106 |
| 6,404,839 B1 | | 6/2002 | Fong et al. .................... 377/47 |
| 6,424,691 B1 | | 7/2002 | Neravetla et al. ............ 377/48 |
| 6,477,186 B1 | * | 11/2002 | Nakura et al. .............. 370/537 |
| 6,600,355 B1 | * | 7/2003 | Nguyen ....................... 327/298 |

* cited by examiner

*Primary Examiner*—Minh Nguyen
(74) *Attorney, Agent, or Firm*—Fenwick & West LLP

(57) ABSTRACT

A clock generator and method generates a plurality of clocks of different frequencies using a delay lock loop and a sequencer. The delay lock loop receives an input clock signal having an input clock frequency and generates a plurality of delayed clock signals each having a frequency same as the input clock frequency and a different phase delay in relation to the input clock signal. The sequencer receives the delayed clock signals and selects one the delayed clock signals at any moment according to a predetermined sequence to generate an output clock signal having an output clock frequency corresponding to the predetermined sequence. The frequency of the output clock signal is controlled by the sequence in which the delayed clock signals are by the sequencer.

18 Claims, 7 Drawing Sheets

UNIVERSAL CLOCK GENERATOR USING DELAY LOCK LOOP

TECHNICAL FIELD

The present invention relates generally to clock generators used in integrated circuits, and more particularly to a universal clock generator using a delay lock loop to generate multiple frequencies of clocks for integrated circuits.

BACKGROUND OF THE INVENTION

Clock generators are widely used in digital integrated circuits to generate clock signals for synchronizing the operation of various components in digital circuits at the frequency of the clock. The components in the digital circuits typically synchronize their operation with one another at the rising edges or falling edges of the clock signals.

Certain components in digital circuits may require operation at frequencies different from those required in other components. In such cases, digital circuits typically include a plurality of clock generators for generating clock signals at different frequencies.

Conventional clock generators use a phase-locked-loop (PLL) scheme and/or a digital divider to generate clock signals. However, conventional clock generators have the disadvantage that it is difficult to control the duty cycles of the clocks generated and that multiple clock generators are sometimes required to generate clock signals with different frequencies.

For example, the duty cycles of the clocks generated by a conventional digital divider are difficult to control, because they are limited to the integer divider numbers of the digital dividers generating the clocks. For instance, a digital divider of 3 (integer) can be designed but a divider of 3.33 (real number) cannot. And, in the case of a digital divider of 3, the duty cycle is limited to 66.6% or 33.3% due to the 2:1 natural integer.

Furthermore, PLLs are not amenable to generating clocks of high frequency since they have to run at an even higher frequency and then their output signals have to be divided down by an integer to the desired clock frequency. In addition, multiple PLLs are required to generate multiple clocks of different frequencies.

Therefore, there is a need for a clock generator that can generate multiple frequencies. There is also a need for a clock generator that can be easily programmed to generate clocks of desired frequencies. There is also a need for a clock generator that can generate clocks of which the duty cycle is easy to control.

SUMMARY OF INVENTION

The present invention provides a universal clock generator that generates a plurality of clocks of different frequencies using a delay lock loop (DLL) and a sequencer. In a first embodiment, the delay lock loop receives an input clock signal having an input clock frequency and generates a plurality of delayed clock signals each having a frequency same as the input clock frequency but having a different phase delay in relation to the input clock signal. The sequencer in the first embodiment receives the delayed clock signals and selects one of the delayed clock signals at any moment according to a predetermined sequence to generate an output clock signal having an output clock frequency corresponding to the predetermined sequence.

The clock generator according to the first embodiment may also comprise a token generator that receives the output clock signal from the sequencer and generates control signals for controlling the sequencer. The control signals generated by the token generator control the sequencer to select only one of the delayed clock signal at each cycle of the output clock signal according to the predetermined sequence. The clock generator may also include a divide-by-2 circuit that receives the output clock signal from the sequencer, reduces the output clock frequency in half, and acdjusts the duty cycle of the output clock signal to fifty percent.

In a second embodiment, the clock generator generates a plurality of clock signals having different frequencies using a delay lock loop, a first sequencer, and a second sequencer. The delay lock loop receives an input clock signal having an input clock frequency and generates a plurality of delayed clock signals each having a frequency that is the same as the input clock frequency but at a different phase delay in relation to the input clock signal. The first sequencer receives the delayed clock signals and selects one of the delayed clock signals at any moment according to a first sequence to generate a first output clock signal having a first output clock frequency corresponding to the first sequence. The second sequencer receives the delayed clock signals and selects one of the delayed clock signals at any moment according to a second sequence to generate a second output clock signal having a second output clock frequency corresponding to the second sequence.

The clock generator of the second embodiment may further comprise a first token generator that receives the first output clock signal from the first sequencer and generates first control signals for controlling the first sequencer, and a second token generator that receives the second output clock signal from the second sequencer and generates second control signals for controlling the second sequencer. The first control signals control the first sequencer to select only one of the delayed clock signals at each cycle of the first output clock signal according to the first sequence, and the second control signals control the second sequencer to select only one of the delayed clock signals at each cycle of the second output clock signal according to the second sequence.

The present invention also provides a method of generating an output clock signal using a delay lock loop and a sequencer. The method receives an input clock signal having an input clock frequency and generates a plurality of delayed clock signals each having a frequency same as the input clock frequency but a different phase delay in relation to the input clock signal. The method selects one of the delayed clock signals at any moment according to a predetermined sequence to generate the output clock signal having an output clock frequency corresponding to the predetermined sequence. The method may also reduce the output clock frequency in half and adjust the duty cycle of the output clock signal to fifty percent.

In another embodiment, the present invention also provides a method of generating a plurality of output clock signals using a DLL and a plurality of sequencers. The method receives an input clock signal having an input clock frequency and generates a plurality of delayed clock signals each having a frequency same as the input clock frequency but a different phase delay in relation to the input clock signal. The method selects one of the delayed clock signals at any moment according to a first sequence to generate a first output clock signal having a first output clock frequency corresponding to the first sequence, and in parallel selects one of the delayed clock signals at any moment according to a second sequence to generate a second output clock signal having a second output clock frequency corresponding to the second sequence. The method may also reduce the first output clock frequency in half and adjust the duty cycle of the first output clock signal to fifty percent, and in parallel reduce the second output clock frequency in half and adjusting the duty cycle of the second output clock signal to fifty percent as well.

The clock generator according to the present invention has the advantage that it is capable of generating very versatile clock signals having different frequencies by use of a plurality of delayed clock signals output from the DLL having different phase delays in a controlled way to select the delayed clock signals according to different sequences. the frequency of the output clock signal is controlled by the sequence in which the clock signals are selected.

DETAILED DESCRIPTION OF EMBODIMENTS

Figure 1:
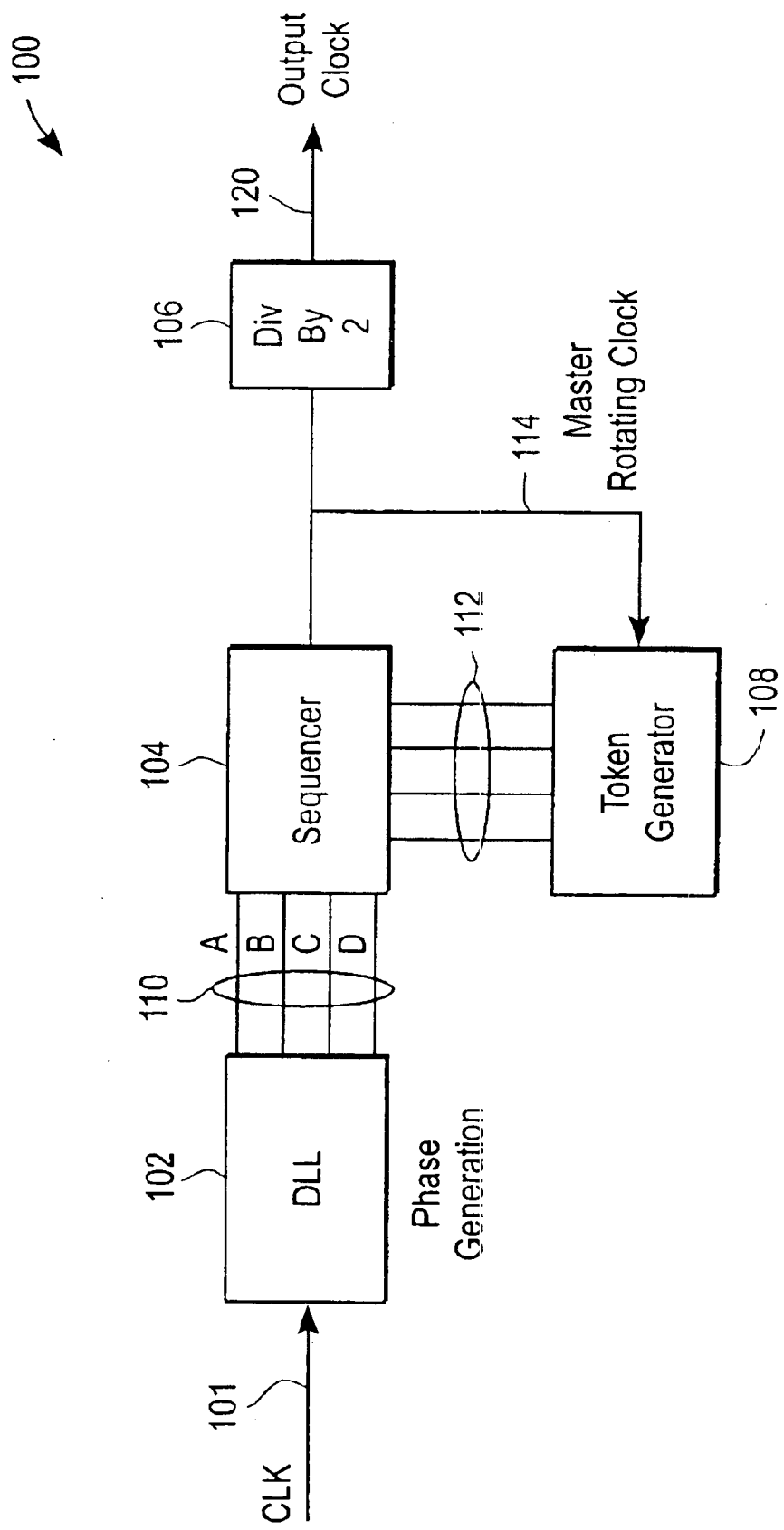
FIG. 1 a block diagram illustrating a universal clock generator according to one embodiment of the invention.

Referring now to the block diagram of FIG. 1, the universal clock generator 100 is capable of generating clock signals of a variety of frequencies with 50% duty cycles, comprises a Delay Lock Loop phase (DLL) 102, a sequencer 104, a divide-by-2 circuit 106, and a token generator 108.

The DLL 102 receives an incoming clock signal 101, locks to the incoming clock 101, and generates a plurality of delayed clock signals 110 based on the incoming clock signal 101. The delayed clock signals 110 have the same frequency as that of the incoming clock signal 101, but are delayed by different delay phases (A, B, C, D). These multiple phases (A, B, C, and D) have finite delays. For example, the delayed clock signals 110 may include 4 delayed clock signals (A, B, C, and D) that are each delayed by different phases, such as different integer multiples of 90 degrees. Although FIG. 1 shows four delayed clock signals 110 output from the DLL 102, it should be noted that any number of delayed clock signals 110 with any amounts of phase delays may be output from the DLL 102 depending upon the implementation of the universal clock generator and the clock frequencies that one desires to obtain. For instance, the delayed clock signals may include sixteen (16) delayed clock signals 110 with different phase delays of various integer multiples of 22.5 degrees.

The phase delays determine the maximum frequency of the output clock signals that can be obtained from the universal clock generator 100. If the incoming clock signal has a frequency of F and the DLL 102 outputs N delayed clock signals 110, then the maximum frequency of the clock signals that can be obtained by the clock generator of the present invention is F*N, which will be evident by the illustration of operations of the clock generator of the present invention as detailed below. Examples of the delayed clock signals 110 are illustrated with reference to FIG. 2.

The sequencer 104 receives the delayed clock signals 110 and continuously selects one of the delayed clock signals 110 according to a sequence determined by the manner in which the sequence control signals 112 received from the token generator 108 are coupled to the sequencer 104. For example, the sequencer 104 may repeatedly select the four delayed clock signals 110 in the sequence of A, B, C, D, A, B, C, D, . . . at their rising edges, as its output clock signal 114. The sequencer 104 may also repeatedly select the four delayed clock signals 110 in the sequence of D, C, B, A, D, C, B, A, . . . at the rising edges of their previously selected delayed clock signals (e.g., delayed clock signal C is selected at the rising edge of delayed clock signal D, and delayed clock signal B is selected at the rising edge of delayed clock signal C, and so on), as its output clock signal 114. Depending upon the sequence in which the sequencer 104 selects the delayed clock signals 110, the frequency of the output clock signals 114 generated by the sequencer 104 varies. The different frequencies of the output clock signal 114 that are dependent upon the sequence of the delayed clock signals will be illustrated in more detail below with reference to FIG. 2.

The token generator 108 receives the output clock signal 114 and uses it as the master rotating clock to generate a series of control signals 112 in a fixed sequence pattern. Only one of the control signals 112 becomes active at any particular moment, and the active control signals 112 switches over to the next control signal 112 on every cycle of the master rotating clock 114. In one embodiment, the token generator 108 may be implemented as a wrap-around shift register that is clocked by the master rotating clock 114. The control signals 112 are coupled to the sequencer 104 to select only one of the delayed clock signals 110 corresponding to the active one of the control signals 112 at any particular moment, for outputting the output clock signal 114.

The divide-by-2 circuit 106 is coupled to the sequencer 104 to receive the output clock signal 114 and generates a final output clock signal 120 having a frequency that is half of the frequency of the output clock signal 114 with a 50% duty cycle. The divide-by-2 circuit 106 is used in the universal clock generator of FIG. 1, if the duty cycle of the output clock 114 is important, because the divide-by-2 circuit 106 ensures good 50% duty cycle performance. It should be noted that the divide-by-2 circuit 106 is an optional component that can be omitted from the universal clock generator 100 of FIG. 1 if the duty cycle of the output clock 114 need not be controlled.

As illustrated above, the universal clock generator 100 of FIG. 1 has the advantage that it is capable of generating very versatile clock signals having different frequencies by use of a plurality of delayed clock signals 110 output from the DLL 102 having different phase delays in a controlled manner to select the delayed clock signals according to different sequences. By employing a self-timed "rotating clock" 114 to select the proper one of the delayed clock signals 110 with the proper phase delay, a very versatile output clock signal 120 can be generated to have a variety of frequencies. Note that the frequency of the output clock 120 is controlled by the sequence in which the delayed clock signals are selected and that it does not matter which delayed clock (which particular phase) is selected first. Therefore, the clock generator of FIG. 1 is self-timed.

In addition, unlike conventional digital clock implementations, the clock generator 100 of FIG. 1 does not use a fixed master clock for synchronized clocking, but rather uses a rotating clock 114 that is associated with the selected phase. The different phases (delayed clock signals) 110 take turns to become the master rotating clock following the controlled sequence. As a result, the newly selected clock maintains the same delay as its predecessor, there is no setup/hold time issue, and the output delay from phase to phase is constant.

Furthermore, the output clock 120 is related to only one edge (rising edge) of the delayed clock signals 10 having different phase delays and is also passed through the divide-by-2 circuit 106. Thus, the duty cycle is well controlled at 50%.

Another advantage of the universal clock generator of FIG. 1 is that it can be easily programmed or modified to generate an output clock signal of different frequency by simply modifying the sequence in which the sequencer 104 selects the delayed clock signals 110 having different phases. This can be easily done by simply modifying the manner in which the control signals 112 are coupled to the sequencer 104 for selection of the delayed clock signals 110. Other components of the clock generator 100, such as the DLL 102, token generator 108, and the divide-by-2 circuit 106 remain the same. This makes the clock generator 100 of FIG. 1 easily programmable with low overhead for generating multiple clocks with different frequencies.

Figure 2:
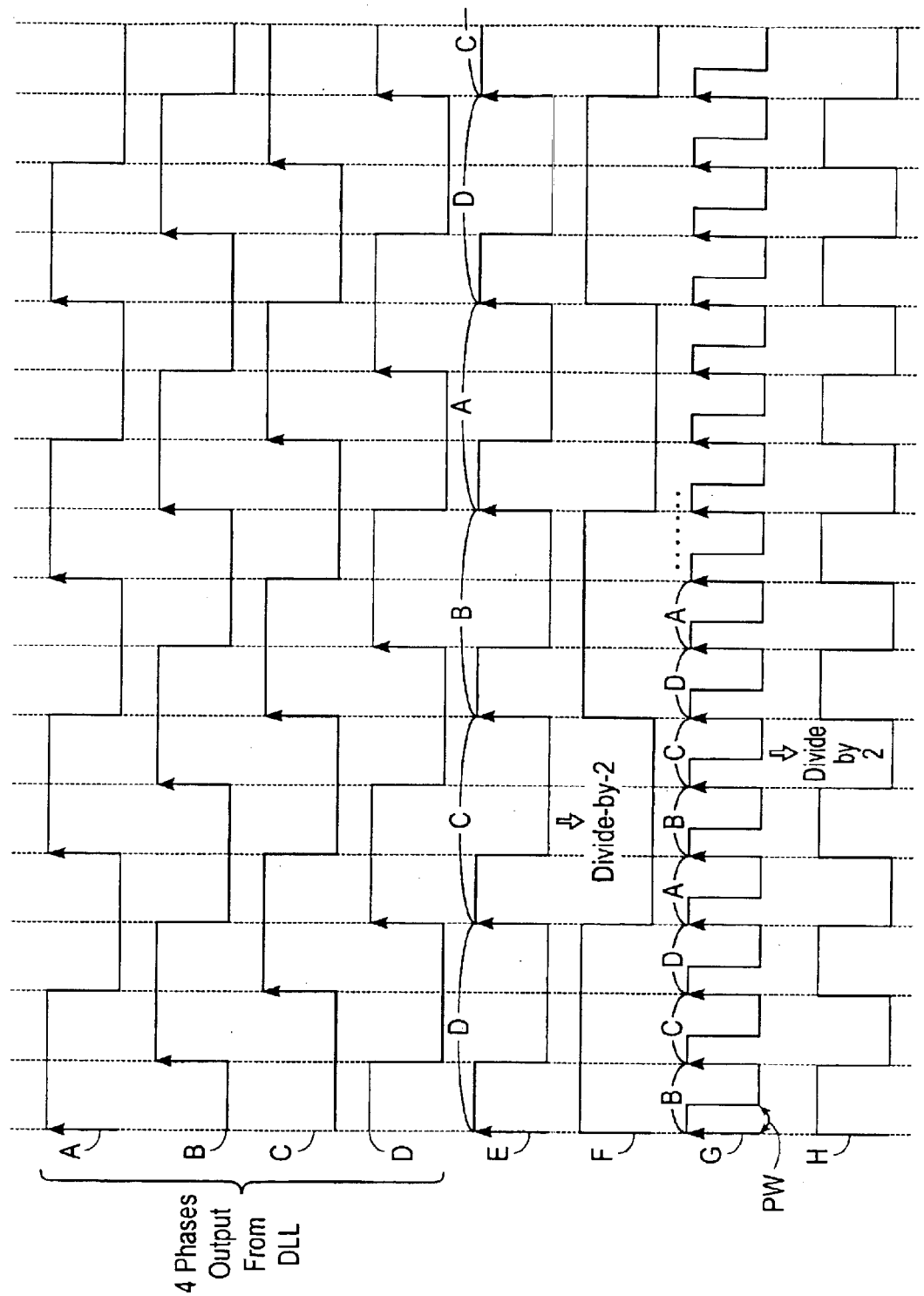
FIG. 2 is a timing diagram illustrating the different phases of delayed clock signals output from the delay lock loop (DLL) in the universal clock generator and the clock of different frequencies generated by the universal clock generator according to one embodiment of the present invention.

FIG. 2 is a timing diagram illustrating the different phases of the delayed clock signals 110 output from the delay lock loop (DLL) 102 in the universal clock generator 100 and the output clock signals 114, 120 of different frequencies generated by the universal clock generator 100 according to one embodiment of the present invention. Referring to FIG. 2, delayed clock signals 110 labeled A, B, C, and D are generated by the DLL 102, each having a 90-degree phase difference from the adjacent one, in this embodiment of the present invention. The sequencer 104 starts selecting the delayed clock signals 110 from their rising edges, and clock signals of different frequencies are generated by using different clock control sequences.

For example, if the sequencer 104 selects the delayed clock signals 110 with the sequence of D, C, B, A, D, C, B, A . . . at the rising edges of the delayed clock signals that were previously selected, then the resulting output clock signal 114 from the sequencer will be clock E shown in FIG. 2. Specifically, delayed clock signal C is selected at the rising edge of delayed clock signal D, and delayed clock signal B is selected at the rising edge of delayed clock signal C, and so on. In FIG; 2, clock E shows each cycle copied from the associated delayed clock signals in the sequence D, C, B, A, . . . . For example, the first cycle of clock E was copied from delayed clock D at the rising edge of delayed clock A, and the second cycle of clock. G was copied from delayed clock C at the rising edge of delayed clock D, and so on. The divide-by-2 circuit 106 may receive the output clock 114 and reduce the frequency in half with accurate 50% duty cycle to generate the final output clock signal 120 as shown in clock F of FIG. 2. As a result, the final output clock 120 has a frequency that is 1/1.5 of the input clock frequency 101 and the universal clock generator 100 of the present invention functions as a divide-by-1.5 circuit in effect.

As another example, if the sequencer 104 selects the delayed clock signals 110 with the sequence of A, B, C, D, A, B, C, D, . . . at the rising edges of the delayed clock signals that were previously selected, then the resulting output clock signal 114 from the sequencer will be clock G shown in FIG. 2. Specifically, delayed clock signal B is selected at the rising edge of delayed clock signal A, and delayed clock signal C is selected at the rising edge of delayed clock signal B, and so on. In FIG. 2, clock G shows each cycle copied from the associated delayed clock signals in the sequence A, B, C, D, . . . . For example, the first cycle of clock G was copied from delayed clock B at the rising edge of delayed clock A, and the second cycle of clock G was copied from delayed clock C at the rising edge of delayed clock B, and so on. The narrow pulse widths PW) in the clock G is present due to and determined by the internal delay of the circuit that uses the clock generator of the present invention, and is shown exaggerated in FIG. 2. The divide-by-2 circuit 106 may receive the output clock 114 and reduce the frequency in half with accurate 50% duty cycle to generate the final output clock signal 120 as shown in clock H of FIG. 2. As a result, the final output clock 120 has a frequency that is twice as high as the frequency of the input clock 101 and the universal clock generator 100 of the present invention functions as a 2× frequency multiplier circuit in effect.

As illustrated above, the universal clock generator 100 of the present invention is capable of generating versatile clock signals having different frequencies by use of a plurality of delayed clock signals 110 output from the DLL 102 having different phase delays in a controlled manner to select the delayed clock signals 110 according to different sequences. The frequency of the output clock is controlled by the sequence in which the delayed clock signals are selected. Any sequence may be used to generate clock signals of different frequencies or different patterns. For example, a sequence of A, C, B, D, A, C, B, D, . . . may be used to generate clock signals corresponding to this pattern. Furthermore, all or only a part of the delayed clock signals may be used, depending upon the nature of the output clock signal to be generated.

Figure 3:
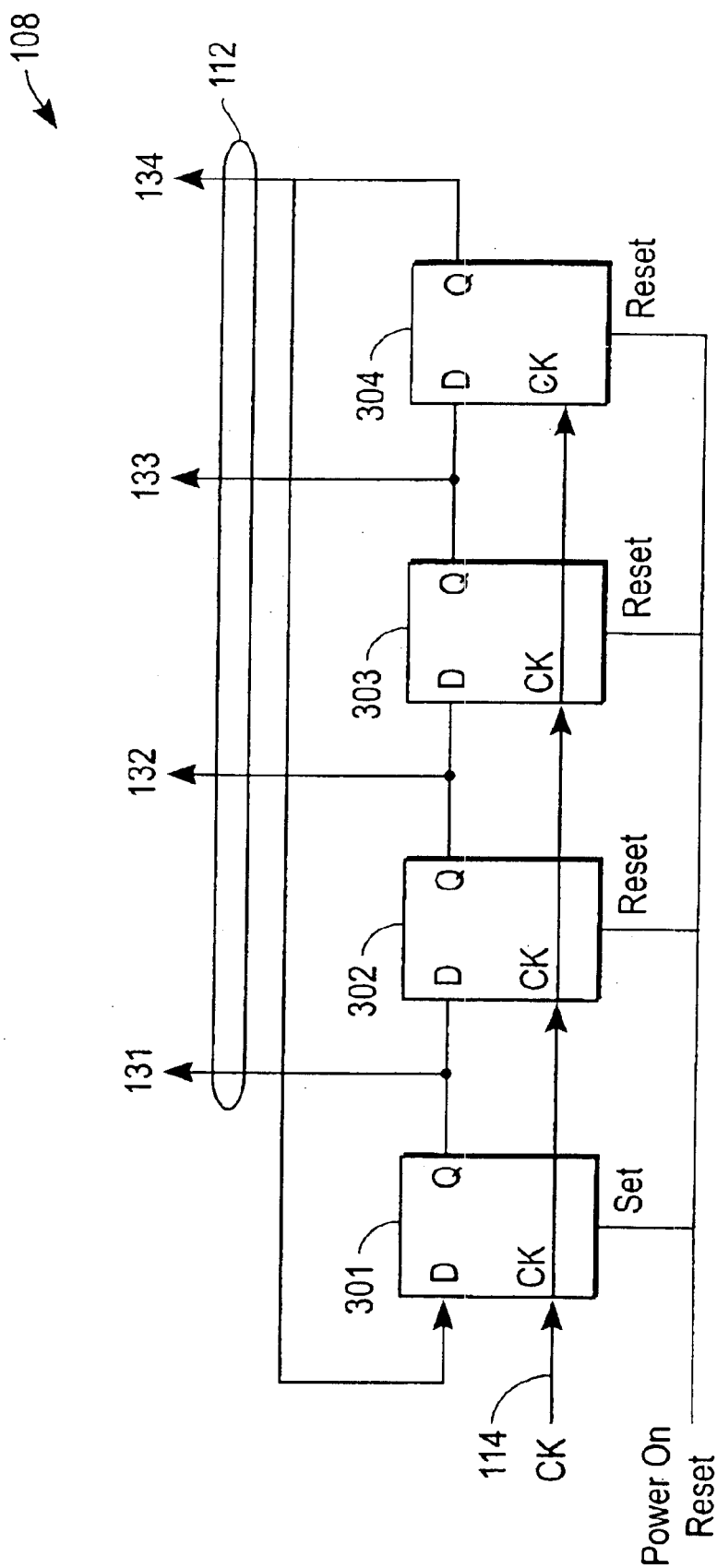
FIG. 3 is a diagram illustrating an example of the token generator in the universal clock generator, according to one embodiment of the present invention.

FIG. 3 is a diagram illustrating an example of the token generator 108 in the universal clock generator 100 of FIG 1, according to one embodiment of the present invention. The token generator 108 is a wrap-around shift register in this embodiment. Referring to FIG. 3, the token generator 108 includes four D-type flip flops 301, 302, 303, 304 that are chained together in series such that D flip flop 302 receives the non-inverting output of D flip flop 301 as its D-input, D flip flop 303 receives the non-inverting output of D flip flop 302 as its D-input, D flip flop 304 receives the non-inverting output of D flip flop 303 as its D-input, and D flip flop 301 receives the non-inverting output of D flip flop 304 as its D-input. The D flip flops 301, 302, 303, 304 are clocked by the master rotating clock 114 output from the sequencer 104. D flip flop 301 is a "set" flip-flop that sets its initial output to "1" on power "on," and the other D flip flops 302, 303, 304 are "reset" flip-flop that resets its initial output to "0" on power "on." The outputs of the D-type flip flops 301, 302, 303, 304 are the control signals 131, 132, 133, 134, respectively, that control the sequencer 104.

When the token generator 108 is powered "on," D flip flop 301 is set to "1" such that the control signal 131 is also "1." The remaining control signals 132, 133, 134 are "0," because the D flip flops 302, 303, 304 are reset to "0" when they are powered "on." The "1" propagates and rotates through the D flip flops 301, 302, 303, 304 at every cycle of the master rotating clock 114. There is only one active ("1") control signal 112 at any time after a power on reset signal. The token generator 108 repeats the same general pattern of output control signals 112 for controlling the sequencer 104. The sequencer 104 arranges its connection with the control signals 112 to determine the specific sequence according to which the delayed clock signals 110 are selected.

Figure 4A:
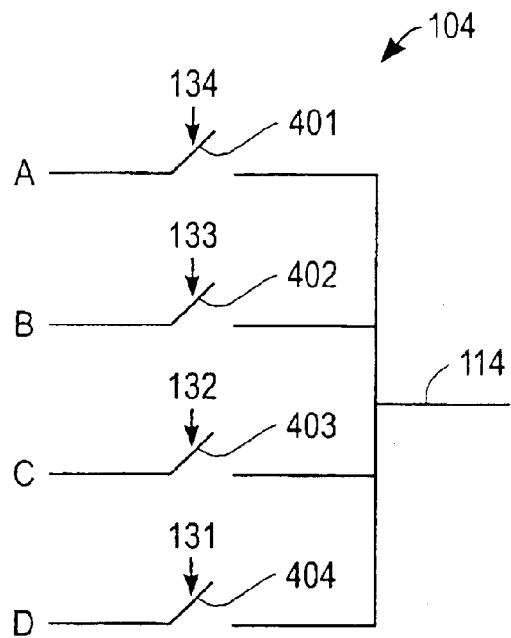
FIGS. 4A and 4B are diagrams illustrating examples of the sequencer in the universal clock generator, according to one embodiment of the present invention.
Figure 4B:
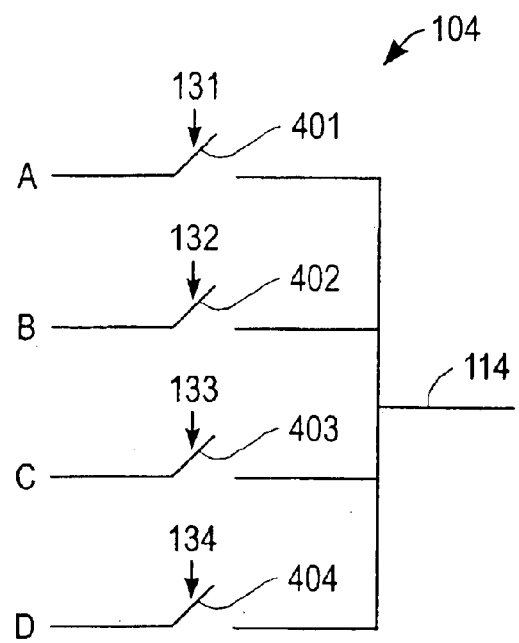

FIGS. 4A and 4B are diagrams illustrating examples of the sequencer 104 in the universal clock generator 100, according to one embodiment of the present invention. The sequencers 104 described in FIGS. 4A and 4B are 4-phase sequencers used when the DLL 102 generates four delayed clock signals 110 of different phase delays. When used with the token generator 108 shown in FIG. 3, the sequencer 104 shown in FIG. 4A would result in selection of delayed clock signals in the sequence D, C, B, A, . . . to generate clock signal E as shown in FIG. 2 and the sequencer 104 shown in FIG. 4B would result in selection of delayed clock signals in the sequence A, B, C, D, . . . to generate clock signal G as shown in FIG. 2. If the number of delayed clock signals 110 output from the DLL 102 changes, then the sequencers 104 are also modified accordingly to be used with the corresponding number of phases.

Referring to FIGS. 4A and 4B, the sequencer 104 is a 4-to-1 multiplexer according to one embodiment of the present invention. The sequencers 104 have 4 inputs and four switches 401, 402, 403, 404 associated with the four inputs. The four inputs are coupled to the four delayed clock signals A, B, C, D output from the DLL 102 shown in FIGS. 1 and 2. The four switches 401, 402, 403, 404 are controlled by the control signals 131, 132, 133, 134, respectively, output from the token generator 108. Since only one of the control signals 131, 132, 133, 134 is active at any given moment, only one of the switches 401, 402, 403, 404 in the multiplexer 104 will be on.

If the control signals 131, 132, 133, 134 are coupled to the switches 404, 403, 402, 401, respectively, the sequencer 102 will select the delayed clock signals 110 in the sequence D, C, B, A, D, C, B, A, . . . as its output clock signal 114, as described in output clock E of FIG. 2. However, if the control signals 131, 132, 133, 134 are coupled to the switches 401, 402, 403, 404, respectively, the sequencer 102 will select the delayed clock signals 110 in the sequence A, B, C, D, A, B, C, D, . . . as its output clock signal 114, as described in output clock G of FIG. 2. By rearranging the manner in which the switches 401, 402, 403, 404 are coupled to the control signals 131, 132, 133, 134, an output clock 114 of different frequency may be generated. The manner in which the control signals 131, 132, 133, 134 are coupled to the switches 401, 402, 403, 404 can be easily rearranged or programmed. Thus, the clock generator 100 of the present invention is very flexible and programmable. The switches 401, 402, 403, 404 can be implemented by transmission gates.

Figure 5:
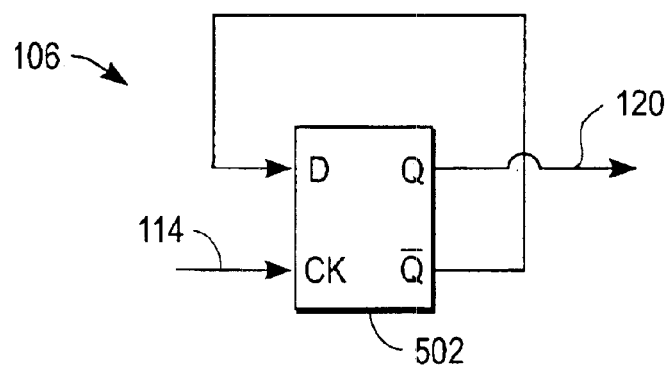
FIG. 5 is a diagram illustrating an example of the divide-by-2 circuit in the universal clock generator, according to one embodiment of the present invention.

FIG. 5 is a diagram illustrating an example of the divide-by-2 circuit 106 in the universal clock generator 100, according to one embodiment of the present invention. The divide-by-2 circuit 106 includes a D-type flip flop 502. The D-type flip flop 502 is clocked by the rising edges of the output clock signal 114 from the sequencer 104. In addition, the D input of the D flip flop 502 is coupled to receive the inverting output of the D flip flop 502, and the non-inverting output of the D flip flop 502 is used as the output clock signal 120. Therefore, the frequency of the clock signal 114 is reduced to half as the final output clock signal 120 and the duty cycle of the output clock signal 120 is maintained at 50%.

Figure 6:
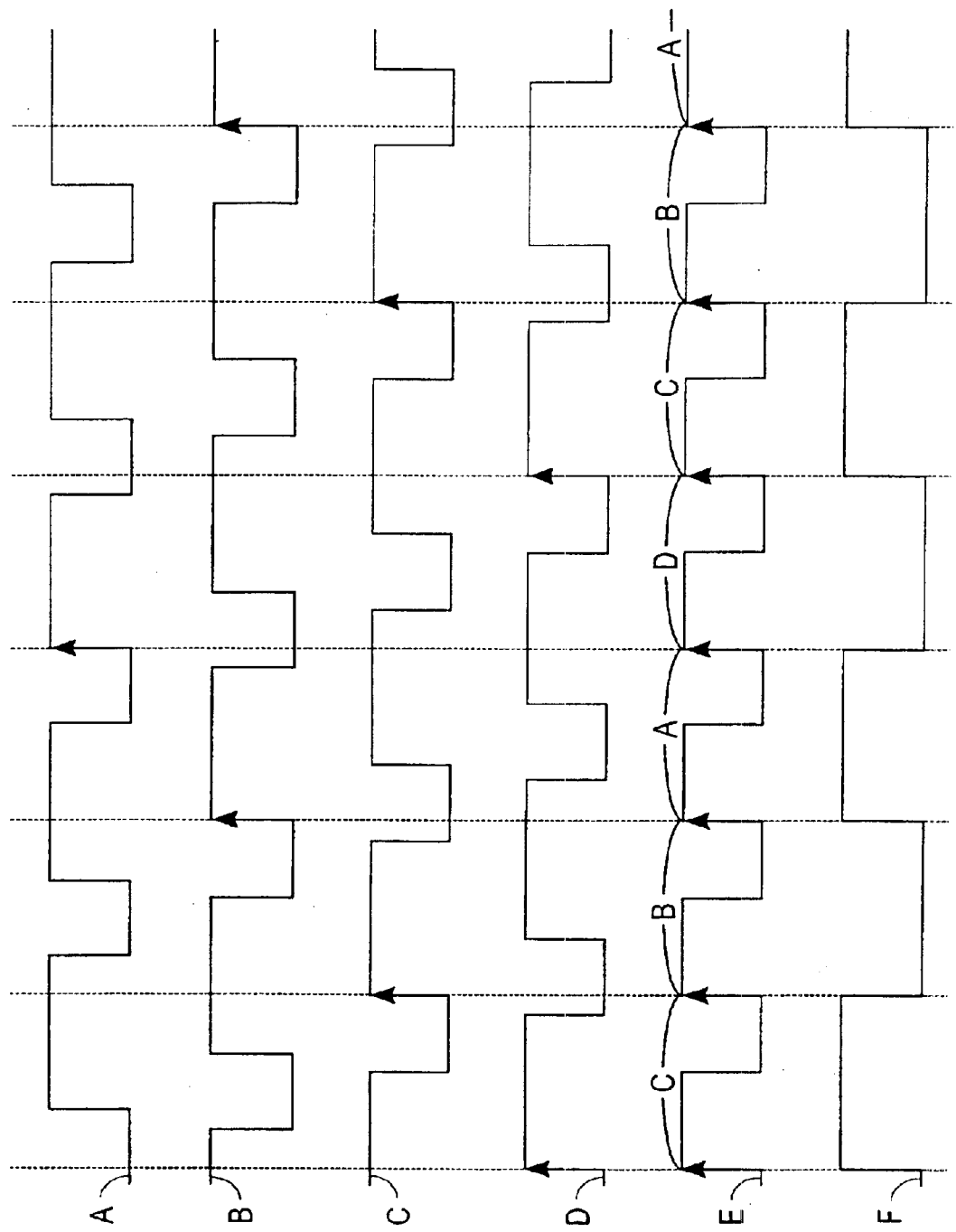
FIG. 6 is a diagram illustrating delayed clock signals with imperfect phases output from the DLL in the universal clock generator and the output clock signal generated by the universal clock generator according to one embodiment of the present invention.

FIG. 6 is a diagram illustrating delayed clock signals 110 with imperfect phases output from the DLL 102 in the universal clock generator 100 and the clock signals generated by the universal clock generator 100 according to one embodiment of the present invention. One deficiency of a general DLL circuit is that it does not preserve the duty cycle well and that the controlled delay usually applies to only one edge. That is, in general a DLL can only align one edge of a clock, so only the delay of one edge (e.g., rising edge) is well controlled, while the other edge (e.g., falling edge) is loose. The advantage of the clock generator 100 of the present invention is that its operation only depends upon the controlled edge and not upon the duty cycle of the delayed clock signals 110 output from DLL 102. FIG. 6 shows that the waveform of the output clock signal of the clock generator of the present invention is insensitive to the duty cycle generated by the DLL.

Referring to FIG. 6, the DLL 102 may output delayed clock signals 110 with imperfect duty cycles (non-50%) as shown in clocks A, B, C, and D of FIG. 6. If the sequencer 104 selects the delayed clock signals 110 in the sequence of D, C, B, A, D, C, B, A . . . , the resulting output clock signal 114 will also have an imperfect duty cycle as shown in clock E of FIG. 6. However, once the clock signal E passes through the divide-by-2 circuit 106, the final clock signal F 120 will have a 50% duty cycle notwithstanding the imperfect duty cycle of the delayed clock signals 110.

Therefore, the divide-by-2 circuit 106 is capable of generating an output clock signal of 50% duty cycle notwithstanding the variations in the duty cycles of the delayed clock signals 110. However, it should be noted that the divide-by-2 circuit 106 is an optional component of the clock generator 100 of the present invention and that the divide-by-2 circuit 106 may be omitted from the clock generator 100 when the duty cycle of the output clock signal is not of importance.

Figure 7:
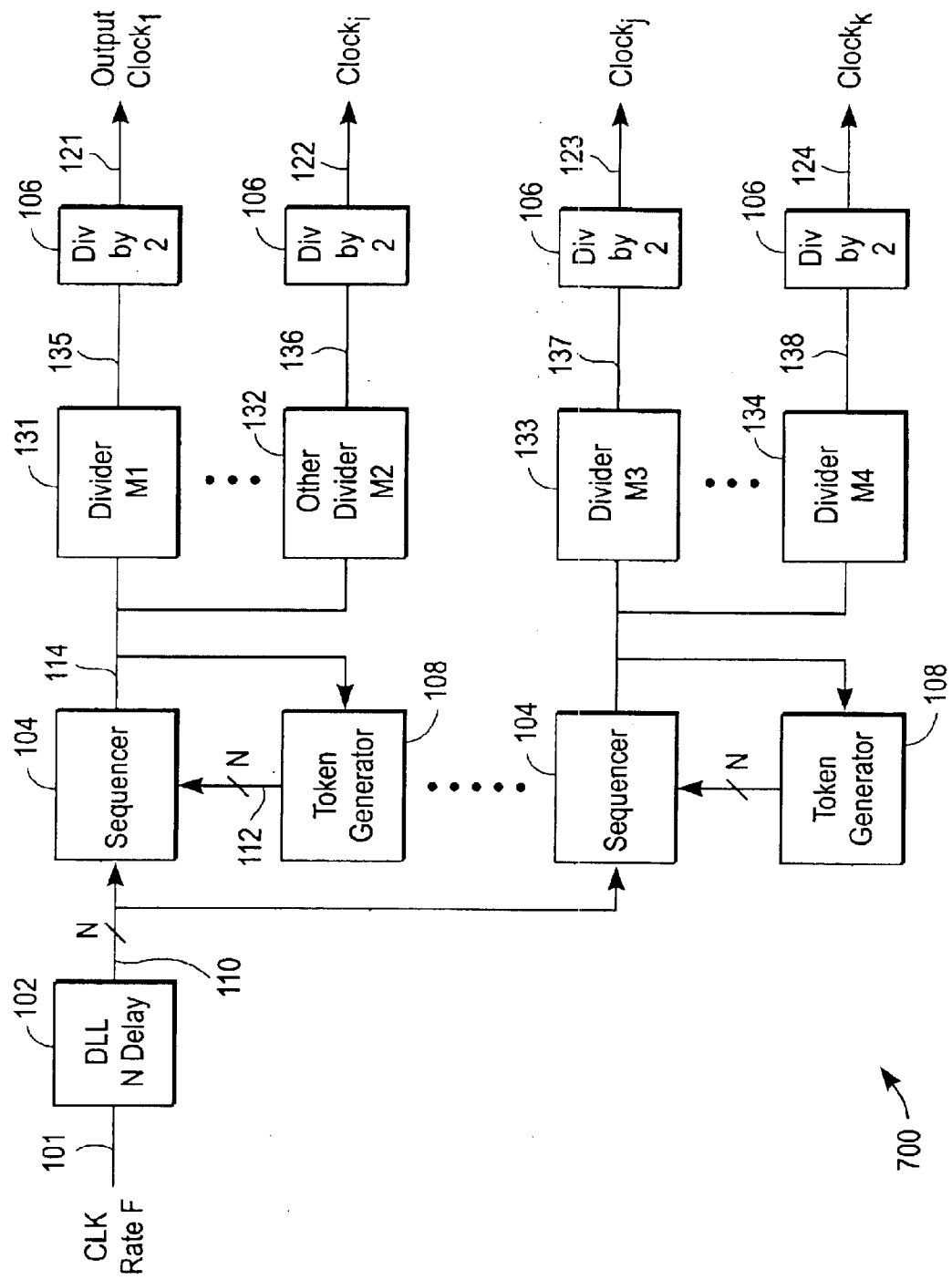
FIG. 7 is a diagram illustrating a universal clock generator generating multiple clock signals of different frequencies, according to another embodiment of the present invention.

FIG. 7 is a diagram illustrating a universal clock generator 700 generating multiple clock signals of different frequencies, according to another embodiment of the present invention. The clock generator 700 of FIG. 7 is identical to the clock generator 100 of FIG. 1, except that (i) a plurality of sets of a sequencer and a token generator are used in the clock generator, and that (ii) additional frequency divider circuits are used in combination with the divide-by-2 circuits. Specifically, the clock generator 700 includes a DLL 102 receiving an input clock signal 101 with frequency F and generating N output clock signals 110 with different phase delays. The N delayed clock signals 110 are coupled to a plurality of sequencers 104, such that the delayed clock signals 110 are shared by the sequencers 104. Token generators 108 are coupled to the sequencers 104 to control the selection of the delayed clock signals 110 in the sequencers 104. The operations of the sequencers 104 and token generators 108 are same as those explained with reference to FIG. 1. The outputs from the sequencers 104 are also coupled to frequency dividers 131, 132, 133, 134, whose outputs 135, 136, 137, 138, respectively, are input to the divide-by-2 circuits 106, to generate output clock signals 121, 122, 123, 124, respectively.

A plurality of clock outputs with various frequencies can be generated by the clock generator 700. The maximum frequency of the output clock signals 114 that can be generated by the sequencers 104 is F multiplied by N, which may be a non-50% duty cycle clock. The description herein assumes that the sequencers 104 are controlled to generate output clock signals 114 of maximum frequency. The dividers 131, 132, 133, 134 divide the frequencies of the output clock signals 114 by M1, M2, M3, and M4, respectively, and the divide-by-2 circuits 106 further divide the frequencies of the clock signals 135, 136, 137, 138 by 2 with a 50% duty cycle. As a result, for example, the final output clock signal 121 will have a frequency of (F*N)/(M1*2) with a 50% duty cycle, while the other output clock signals 122, 123, 124 will have different frequencies of (F*N)/(M2*2),(F*N)/(M3*2), (F*N)/(M4*2), respectively, with 50% duty cycles.

Figures 8, 9:
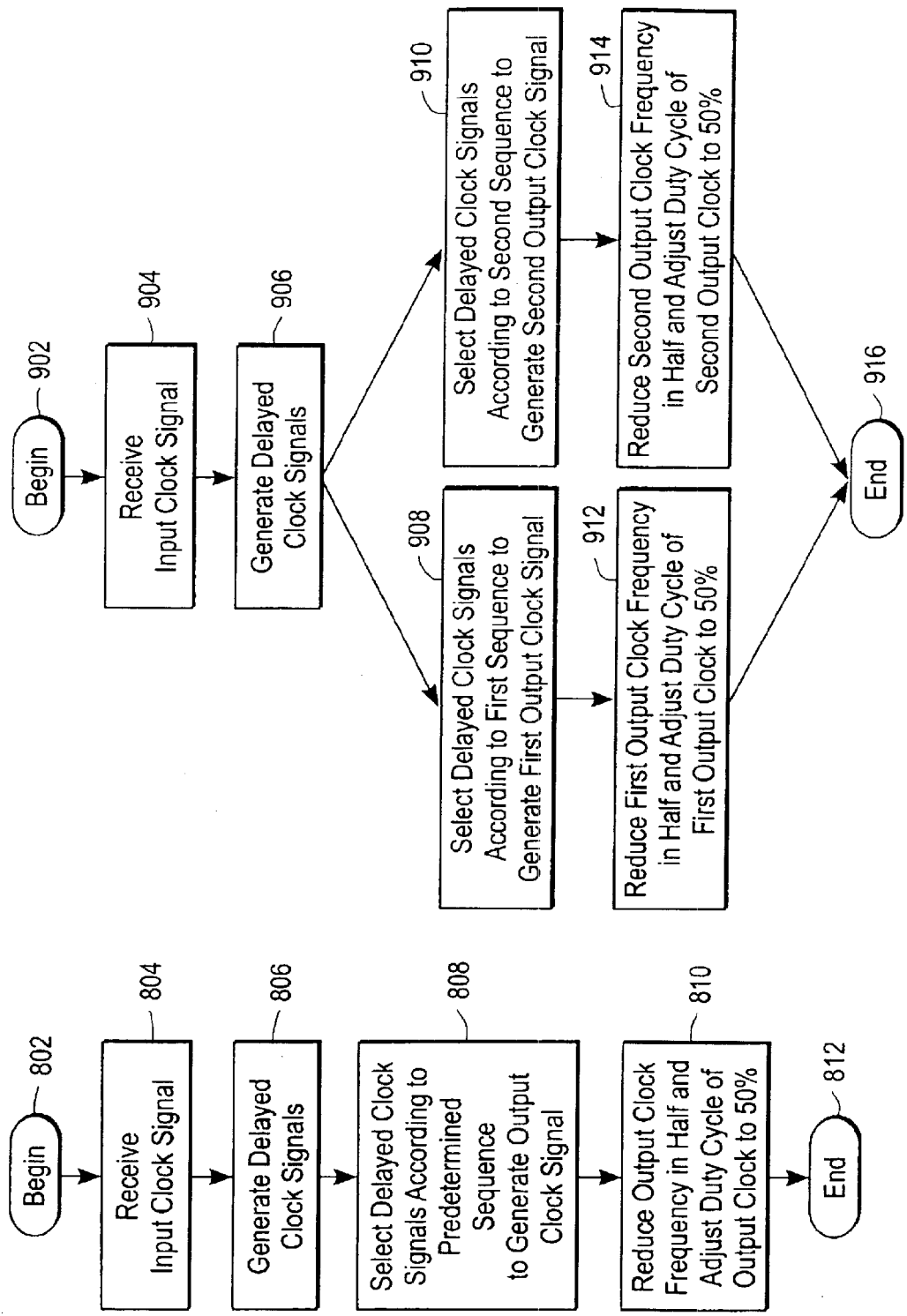
FIG. 8 is a flowchart illustrating a method of generating an output clock signal according to one embodiment of the present invention.
FIG. 9 is a flowchart illustrating a method of generating output clock signals of different frequencies, according to another embodiment of the present invention.

FIG. 8 is a flowchart illustrating a method of generating an output clock signal according to one embodiment of the present invention. As the method begins 802, an input clock signal is received 804 having an input clock frequency. A plurality of delayed clock signals are generated 806 each having a frequency same as the input clock frequency but having a different phase delay in relation to the input clock signal. Then, one of the delayed clock signals is selected 808 at any moment according to a predetermined sequence to generate the output clock signal having an output clock frequency corresponding to the predetermined sequence. The output clock frequency may also be reduced 810 by half and the duty cycle of the output clock signal may also be adjusted 810 to fifty percent, and the method ends 812.

FIG. 9 is a flowchart illustrating a method of generating a plurality of output clock signals of different frequencies, according another embodiment of the present invention. As the method begins 902, an input clock signal having an input clock frequency is received 904. A plurality of delayed clock signals are generated 906 each having a frequency same as the input clock frequency but having a different phase delay in relation to the input clock signal. Then, one of the delayed clock signals is selected 908 at any moment according to a first sequence to generate a first output clock signal having a first output clock frequency corresponding to the first sequence, and in parallel with step 908 one of the delayed clock signals is selected 910 at any moment according to a second sequence to generate a second output clock signal having a second output clock frequency corresponding to the second sequence. The first output clock frequency is reduced 912 by half and the duty cycle of the first output clock signal is adjusted 912 to fifty percent, and in parallel with step 912 the second output clock frequency is reduced 914 by half and the duty cycle of the second output clock signal is adjusted 914 to fifty percent. Then, the method ends 916.

The sequencer and the token generator are not limited to those described herein and can be modified as long as they are capable of selecting delayed clock signals output from DLLs according to a prescribed sequence. Although one embodiment of the sequencer of the present invention selects delayed clock signals output from the DLL at the rising edges of the delayed clock signals that were previously selected, the sequencer may be modified to select the delayed clock signals at any other timing, such as the falling edges of the delayed clock signals. The divide-by-2 circuit is optional to the clock generator and can be omitted if the duty cycle of the output clock signal is not important.

What is claimed is:

1. A clock generator comprising:
   a delay lock loop receiving an input clock signal having an input clock frequency and generating a plurality of delayed clock signals each having a frequency same as the input clock frequency and a different phase delay in relation to the input clock signal;
   a sequencer coupled to the delay lock loop to receive the delayed clock signals and selecting one of the delayed clock signals at any moment according to a predetermined sequence to generate an output clock signal having an output clock frequency corresponding to the predetermined sequence; and
   a token generator coupled to receive the output clock signal from the sequencer and generating control signals for controlling the sequencer, the control signals controlling the sequencer to select one of the delayed clock signals at every cycle of the output clock signal according to the predetermined sequence.

2. The clock generator of claim 1, wherein the token generator comprises a wrap-around shift register clocked by the output clock signal as a rotating clock and generating the control signals.

3. The clock generator of claim 2, wherein the wrap-around shift register comprises a plurality of D-type flip flops connected in series, one of the D-type flip flops being set and the remaining D-type flip flops being reset in response to the clock generator being powered on.

4. The clock generator of claim 1, wherein the sequencer comprises a multiplexer receiving the delayed clock signals and selecting one of the delayed clock signals at any moment as the output clock signal according to the predetermined sequence in response to the control signals.

5. The clock generator of claim 1, further comprising a divide-by-2 circuit coupled to receive the output clock signal from the sequencer for reducing the output clock frequency by half and adjusting a duty cycle of the output clock signal to fifty percent.

6. The clock generator of claim 5, wherein the divide-by-2 circuit comprises a D-type flip flop clocked by the output clock signal, an inverting output of the D-type flip flop being coupled to a data input of the D-type flip flop.

7. A clock generator comprising:
   a delay lock loop receiving an input clock signal having an input clock frequency and generating a plurality of delayed clock signals each having a frequency same as the input clock frequency and a different phase delay in relation to the input clock signal;
   a first sequencer coupled to the delay lock loop to receive the delayed clock signals and selecting one of the delayed clock signals at any moment according to a first sequence to generate a first output clock signal having a first output clock frequency corresponding to the first sequence;
   a second sequencer coupled to the delay lock loop to receive the delayed clock signals and selecting one of the delayed clock signals at any moment according to a second sequence to generate a second output clock signal having a second output clock frequency corresponding to the second sequence;
   a first token generator coupled to receive the first output clock signal from the first sequencer and Generating first control signals for controlling the first sequencer, the first control signals controlling the first sequencer to select one of the delayed clock signals at every cycle of the first output clock signal according to the first sequence; and a second token generator coupled to receive the second output clock signal from the second sequencer and generating second control signals for controlling the second sequencer, the second control signals controlling the second sequencer to select one of the delayed clock signals at every cycle of the second output clock signal according to the second sequence.

8. The clock generator of claim 7, wherein:

the first token generator comprises a first wrap-around shift register clocked by the first output clock signal as a first rotating clock and generating the first control signals; and the second token generator comprises a second wrap-around shift register clocked by the second output clock signal as a second rotating clock and generating the second control signals.

9. The clock generator of claim 8, wherein:

the first shift register comprises a first plurality of D-type flip flops connected in series, one of the first D-type flip flops being set and the remaining first D-type flip flops being reset in response to the clock generator being powered on; and the second shift register comprises a second plurality of D-type flip flops connected in series, one of the second D-type flip flops being set and the remaining second D-type flip flops being reset in response to the clock generator being powered on.

10. The clock generator of claim 7, wherein:

the first sequencer comprises a first multiplexer receiving the delayed clock signals and selecting one of the delayed clock signals at any moment as the first output clock signal according to the first sequence in response to the first control signals; and the second sequencer comprises a second multiplexer receiving the delayed clock signals and selecting one of the delayed clock signals at any moment as the second output clock signal according to the second sequence in response to the second control signals.

11. The clock generator of claim 7, further comprising: a first divide-by-2 circuit coupled to receive the first output clock signal from the first sequencer for reducing the first output clock frequency by half and adjusting a duty cycle of the first output clock signal to fifty percent; and a second divide-by-2 circuit coupled to receive the second output clock signal from the second sequencer for reducing the second output clock frequency by half and adjusting a duty cycle of the second output clock signal to fifty percent.

12. The clock generator of claim 11, wherein:

the first divide-by-2 circuit comprises a first D-type flip flop clocked by the first output clock signal, an inverting output of the first D-type flip flop being coupled to a data input of the first D-type flip flop; and the second divide-by-2 circuit comprises a second D-type flip flop clocked by the second output clock signal, an inverting output of the second D-type flip flop being coupled to a data input of the second D-type flip flop.

13. A method of generating an output clock signal, the method comprising:

receiving an input clock signal having an input clock frequency;

generating a plurality of delayed clock signals each having a frequency same as the input clock frequency and a different phase delay in relation to the input clock signal;

selecting one of the delayed clock signals at any moment according to a predetermined sequence to generate the output clock signal having an output clock frequency corresponding to the predetermined sequence; and receiving the output clock signal and generating control signals for controlling the selection of one of the delayed clock signals at every cycle of the output clock signal according to the predetermined sequence.

14. The method of claim 13, further comprising reducing the output clock frequency by half and adjusting a duty cycle of the output clock signal to fifty percent.

15. A method of generating a plurality of output clock signals, the method comprising:

receiving an input clock signal having an input clock frequency;

generating a plurality of delayed clock signals each having a frequency same as the input clock frequency and a different phase delay in relation to the input clock signal;

selecting one of the delayed clock signals at any moment according to a first sequence to generate a first output clock signal having a first output clock frequency corresponding to the first sequence;

selecting one of the delayed clock signals at any moment according to a second sequence to generate a second output clock signal having a second output clock frequency corresponding to the second sequence;

receiving the first output clock signal and generating first control signals for controlling the selection of one of the delayed clock signals at every cycle of the first output clock signal according to the first sequence; and receiving the second output clock signal and generating second control signals for controlling the selection of one of the delayed clock signals at every cycle of the output clock signal according to the second sequence.

16. The clock generator of claim 15, further comprising:

reducing the first output clock frequency by half and adjusting a duty cycle of the first output clock signal to fifty percent; and reducing the second output clock frequency by half and adjusting a duty cycle of the second output clock signal to fifty percent.

17. A clock generator comprising:

delay lock loop means for receiving an input clock signal having an input clock frequency and generating a plurality of delayed clock signals each having a frequency same as the input clock frequency and a different phase delay in relation to the input clock signal;

sequencer means for receiving the delayed clock signals and selecting one of the delayed clock signals at any moment according to a predetermined sequence to generate an output clock signal having an output clock frequency corresponding to the predetermined sequence; and token generator means for receiving the output clock signal from the sequencer means and for generating control signals for controlling the sequencer means, the control signals controlling the sequencer means to select one of the delayed clock signals at every cycle of the output clock signal according to the predetermined sequence.

18. The clock generator of claim 17, further comprising frequency divider means coupled to the sequencer means for reducing the output clock frequency by half and adjusting a duty cycle of the output clock signal to fifty percent.

* * * * *